United States Patent [19]
Kuzumoto et al.
[11] 4,131,864
[45] Dec. 26, 1978

[54] LOW VOLTAGE COMPENSATOR FOR POWER SUPPLY IN A COMPLEMENTARY MOS TRANSISTOR CRYSTAL OSCILLATOR CIRCUIT

[75] Inventors: Takatoshi Kuzumoto, Yao; Kiyoshi Kumata, Tenri; Keizo Yamamoto, Nara, all of Japan

[73] Assignee: Sharp Kabushiki Kaisha, Osaka, Japan

[21] Appl. No.: 811,860

[22] Filed: Jun. 30, 1977

[30] Foreign Application Priority Data

Jul. 1, 1976 [JP] Japan .............................. 51-87656[U]

[51] Int. Cl.[2] ................................................ H03B 5/36

[52] U.S. Cl. .................................. 331/116 R; 331/64; 58/23 AC

[58] Field of Search ................. 331/108 D, 116 R, 64; 58/23

[56] References Cited

U.S. PATENT DOCUMENTS 4,064,468 12/1977 Kumata .................................. 331/116

*Primary Examiner*—John Kominski
*Attorney, Agent, or Firm*—Birch, Stewart, Kolasch & Birch

[57] ABSTRACT

A resistor is connected to the source of a C-MOS inverter included within a crystal oscillator circuit in order to reduce the power dissipation in the crystal oscillator circuit. A switching transistor is connected in parallel to said resistor, said switching transistor being responsive to an LED display switch for enabling LED display or an illumination lamp switch for illuminating a liquid crystal display. The switching transistor shunts the resistor in response to actuation of the LED display switch or the illumination lamp.

6 Claims, 5 Drawing Figures

LOW VOLTAGE COMPENSATOR FOR POWER SUPPLY IN A COMPLEMENTARY MOS TRANSISTOR CRYSTAL OSCILLATOR CIRCUIT

BACKGROUND OF THE INVENTION

The present invention relates to a complementary MOS transistor crystal oscillator circuit and, more particularly, to a low voltage compensator for a power supply in a complementary MOS transistor crystal oscillator circuit.

A C-MOS circuit is conventionally used in an electronic device which requires low power dissipation, especially, in an electronic wristwatch employing a battery of low capacitance.

In an electronic timepiece, a C-MOS crystal oscillator circuit is usually employed, in which a large part of power of the total power dissipation is consumed, because the C-MOS crystal oscillator circuit operates at the highest frequency in the electronic timepiece. Therefore, it is required to reduce the power dissipation at the C-MOS crystal oscillator circuit in order to minimize the total power dissipation in the electronic timepiece.

To this end, it has been proposed to connect a resistor to the source of the transistor included within a C-MOS inverter employed in the crystal oscillator circuit, thereby limiting the current flowing through the C-MOS inverter. However, a voltage $V_D$ applied to the C-MOS inverter is unavoidably decreased by a voltage reduction $V_S$ at the resistor. That is, $V_D = V_{DD} - V_S$, when a power supply level is $V_{DD}$ and the $V_{SS}$ is maintained at ground potential. Therefore, the permissible low voltage for the C-MOS inverter must be selected at a level lower than that of the crystal oscillator circuit by the voltage reduction $V_S$ at the resistor connected to the source of the C-MOS inverter. This results in a requirement that the gain of the C-MOS inverter must be considerably high. The transistors required for obtaining a high gain enclosed within the C-MOS inverter take up a large amount of space.

OBJECTS AND SUMMARY OF THE INVENTION

Accordingly, an object of the present invention is to provide a complementary MOS transistor crystal oscillator circuit which low power dissipation.

Another object of the present invention is to provide a complementary MOS transistor crystal oscillator circuit which can operate in a stable manner without regard to the variation of the power supply voltage.

Still another object of the present invention is to provide a low voltage compensator for the power supply in a complementary MOS transistor crystal oscillator circuit employed in an electronic wristwatch.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a switching transistor is connected in parallel to a resistor connected to the source of a transistor included within a C-MOS inverter employed in a crystal oscillator circuit.

The switching transister is maintained off when an indication control signal is not derived from a control switch which functions to enable the display, for example, an LED display switch or an illumination lamp switch of a liquid crystal display, thereby limiting the current flowing through the C-MOS inverter with the use of the resistor connected to the source of the transistor included within the C-MOS inverter. When the indication control signal is derived from the control switch and introduced into the switching transistor, the switching transistor is closed, thereby shunting the resistor connected to the source of the transistor included within the C-MOS inverter. At this moment, the C-MOS inverter is connected directly to receive the power source voltage ($V_{DD} - V_{SS}$). The aforementioned operation of the crystal oscillation circuit permits the driving voltage of said crystal oscillation circuit to be at a minimum.

Therefore, the reduced driving voltage of the crystal oscillator circuit is proper for operating the C-MOS inverter without regard to the resistance of the source resistor. Also, the power dissipation of the crystal oscillation circuit is minimized by means of the large resistance of the source resistor.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
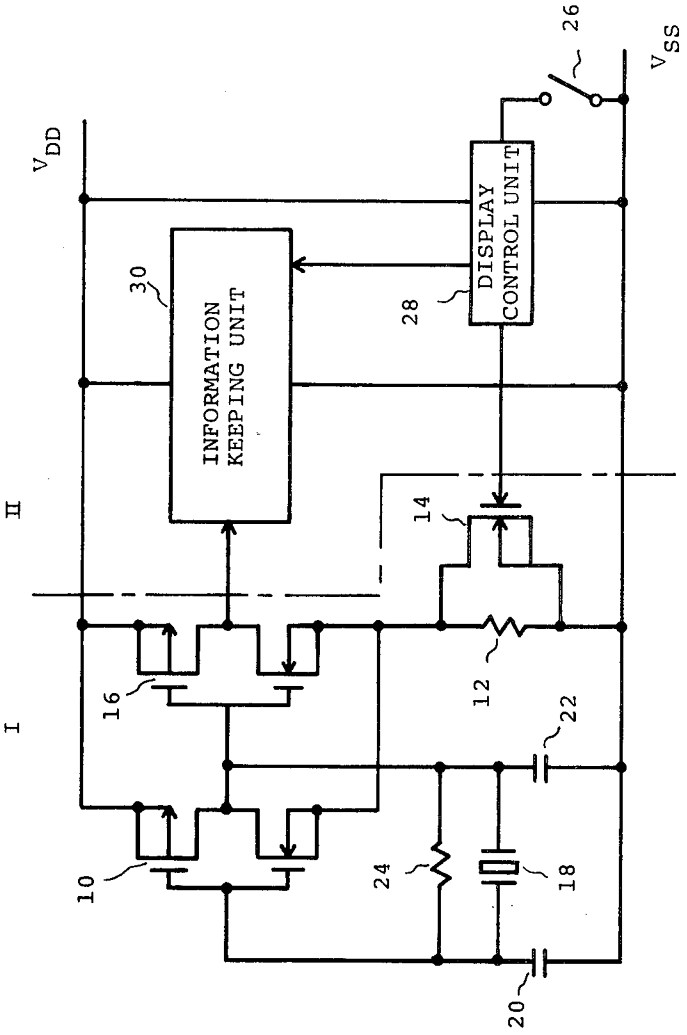
FIG. 1 is a circuit diagram of an embodiment of a complementary MOS transistor crystal oscillator circuit of the present invention.

Referring now to FIG. 1, there is illustrated one embodiment of the present invention including a complementary MOS transistor crystal oscillator circuit of the present invention which mainly comprises a crystal oscillation circuit I and a control circuit II including a time keeping circuit, a decoder, and a display control cirucit.

The crystal oscillation circuit I comprises an oscillation C-MOS inverter 10 for providing the crystal oscillation, a source resistor 12 connected to the source of the N-channel transistor included within the oscillation C-MOS inverter 10, a switching MOS transistor 14 connected to the source of the N-channel transistor in parallel to the source resistor 12, a shaper C-MOS inverter 16 for providing the shaping circuit, a quartz crystal vibrator 18 connected between the input and output terminals of the oscillation C-MOS inverter 10, a feedback circuit connected between the input and output terminals of the oscillation C-MOS inverter 10, said feedback circuit including a load capacitor 20 and an input site capacitor 22, and a feedback resistor 24 connected, in a parallel fashion, to the feedback circuit for controlling the switching level of the oscillation C-MOS inverter 10.

The control circuit II comprises a display switch 26 for controlling the LED display, a display control unit 28, and an information keeping unit 30 including a time-keeping unit, a decoder, and a display unit. The display control unit 28 develops a display control signal in response to the actuation of the display switch 26, said display control signal driving the switching MOS transistor 14. The display control signal derived from the display control unit 28 takes the potential level $V_{DD}$ during the enabling of the display and $V_{SS}$ when the display is not enabled.

The switching MOS transistor 14 is maintained off when the display control signal of the potential $V_{SS}$ is introduced into the gate of said transistor 14 when the display is not enabled. The oscillation C-MOS inverter 10 and the shaper C-MOS inverter 16 are connected to the power supply voltage through the source resistor 12 which limits the current flowing through the C-MOS inverters 10 and 16. The power dissipation of the oscillation inverter 10 is minimized by the enlargement of the resistance of the source resistor 12 which is restrained to the value available to match the oscillation C-MOS inverter 10 with the shaper C-MOS inverter 16.

The switching MOS transistor 14 is turned on by means of the introduction of the display control signal of the potential level $V_{DD}$ into the gate of said transistor 14, when the display switch 26 is actuated and the LED display is enabled. As a result, the oscillation C-MOS inverter 10 and the shaper C-MOS transistor 16 are directly supplied with the power source voltage ($V_{DD} - V_{SS}$) because of the shunting of the source resistor 12.

It will be clear from the foregoing description that the oscillation C-MOS inverter 10 is allowed to oscillate with a more reduced power supply voltage ($V_{DD} - V_{SS}$) and, therefore, the wide operation range of the crystal oscillator circuit I is achieved.

Figure 2:
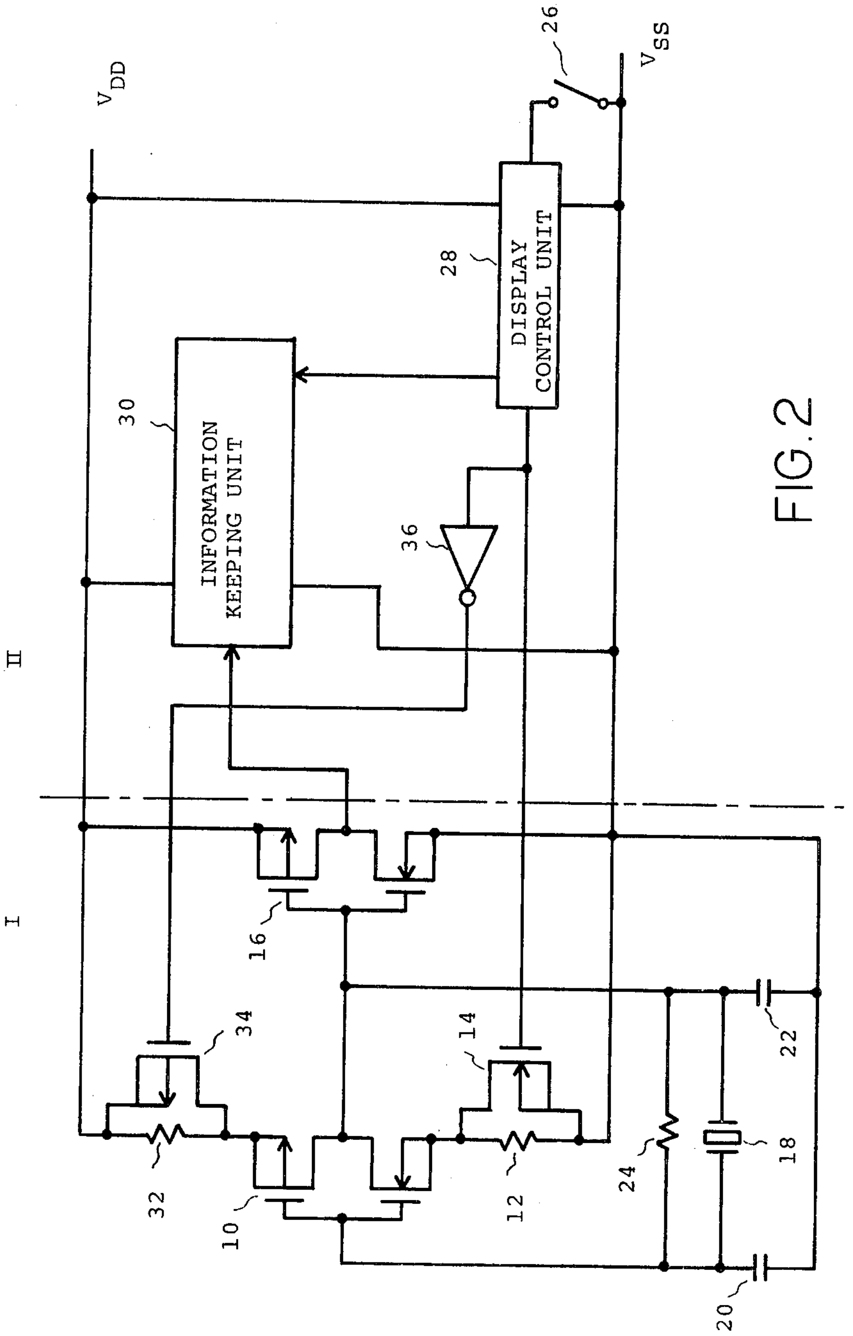
FIG. 2 is a circuit diagram of another embodiment of a complementary MOS transistor crystal oscillator circuit of the present invention.

FIG. 2 shows another embodiment of the present invention, wherein two resistors are connected to the sources of the two MOS FETs included within the C-MOS inverter. Like elements corresponding to those of FIG. 1 are indicated by like numerals.

The crystal oscillation circuit I comprises the oscillation C-MOS inverter 10, the shaper C-MOS inverter 16, the quartz crystal vibrator 18, the feedback loop including the capacitors 20 and 22, and the feedback resistor 24. The crystal oscillation circuit I further comprises the resistor 12 connected to the source of the N-channel transistor included within the C-MOS inverter 10, and another resistor 32 connected to the source of the P-channel transistor included within the C-MOS inverter 10. The resistors 12 and 32 function, in combination, to limit the current flowing through the C-MOS inverter 10. A switching MOS transistor 34 is connected to the source of the P-channel transistor in parallel to the source resistor 32.

The control circuit II comprises the display switch 26, the display control unit 28, the information keeping unit 30, and an inverter 36 connected between the switching MOS transistor 34 and the display control unit 28.

The switching MOS transistor 14 is maintained off when the display control signal of the potential level $V_{SS}$ is introduced into the gate of said transistor 14 when the LED display is not enabled. The switching MOS transistor 34 is also maintained off because of the application of the display control signal of the potential level $V_{DD}$ to the gate of said transistor 34. The oscillation C-MOS inverter 10 is connected to the power voltage through the source resistors 12 and 32 with limiting the current flow thereof by said resistors 12 and 32.

The switching MOS transistors 14 and 34 are turned on when the display switch 26 is actuated. The display control signal of the potential level $V_{DD}$ is developed from the display control unit 28 in response to the display switch 26. As a result, the display control signal of the potential level $V_{DD}$ is introduced into the gate of the switching MOS transistor 14 and the same of the potential level $V_{SS}$ is introduced into the switching MOS transistor 34. Therefore, the oscillation C-MOS inverter 10 is connected directly to the power supply voltage ($V_{DD}-V_{SS}$).

Figure 3:
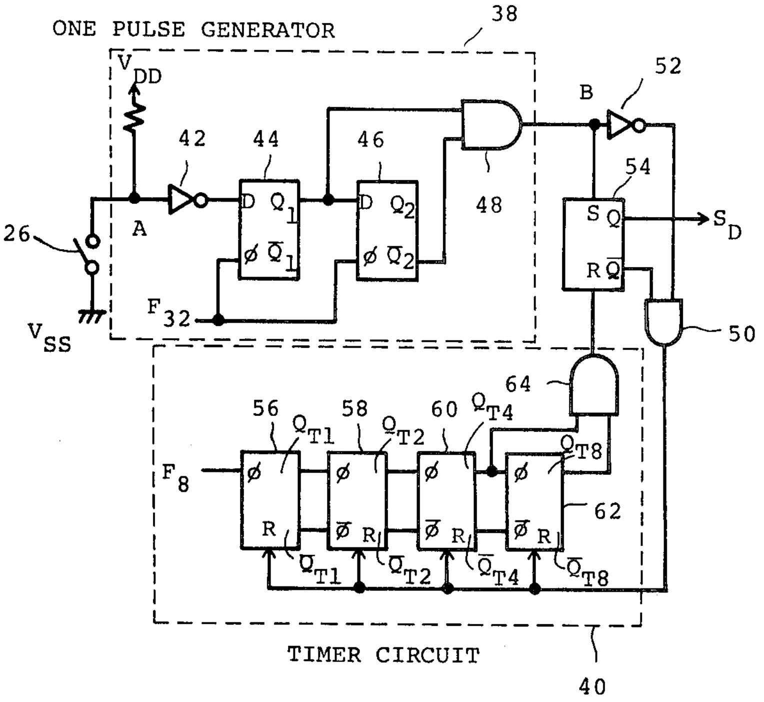
FIG. 3 is a circuit diagram of a display control unit included within the circuit of FIGS. 1 and 2.
Figure 4:
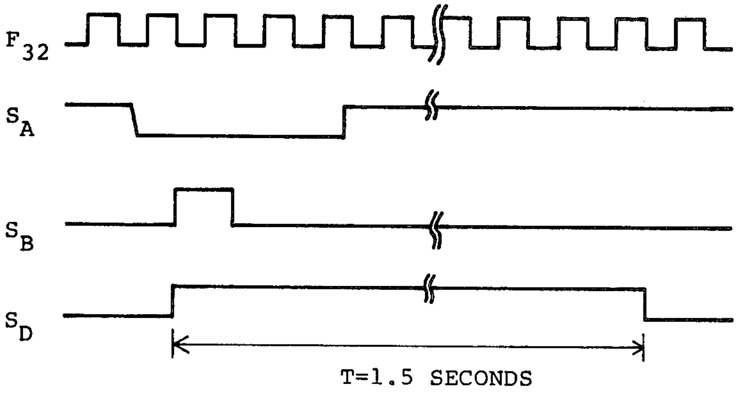
FIG. 4 is a wave-form chart showing various signals occurring within the circuit of FIG. 3.

FIG. 3 shows the circuit configuration of the display control unit 28 included within the circuits of FIGS. 1 and 2. FIG. 4 shows the wave-forms in the points of FIG. 3.

The display control unit 28 mainly comprises "one pulse generator" 38 and a timer circuit 40 to control the LED display which indicates the time information for a while and then the indication is extinguished in response to the display switch 26.

A signal $S_A$ of the potential $V_{SS}$ occurs at a node A in the one pulse generator 38 during the actuation of the display switch 26. The signal $S_A$ is introduced into an inverter 42 and then applied to a D type flip-flop 44. The D type flip-flop 44 further receives a signal $F_{32}$ of 32 Hz and develops a signal which is introduced into another D type flip-flop 46 and an AND gate 48. A signal $S_B$ is revealed at a node B through the AND gate 48 which receives signals derived from the D type flip-flops 44 and 46, said signal $S_B$ indicating the existence of the actuation of display switch 26. An LED display enabling signal $S_D$ is developed from an RS flip-flop 54 in accordance with the signal $S_B$.

The signal $S_B$ is further introduced into an AND gate 50 after converted by an inverter 52 together with the signal $\overline{Q}$ derived from the RS flip-flop 54. A signal developed from the AND gate 50 is applied to the timer circuit 40 to set the timer circuit 40. Four binary counters 56, 58, 60 and 62 included within the timer circuit 40 count the display time T=1.5 seconds. The binary counter 56 receives a signal $F_8$ of 8 Hz.

An AND gate 64 is conductive when $Q_{T4}=1$, the $Q_{T4}$ being derived from the binary counter 60, and $Q_{T8}=1$, the $Q_{T8}$ being derived from the binary counter 62. At this time, the LED display enabling signal $S_D$ is reset and, simultaneously, the timer circuit 40 is also reset. The LED display enabling signal $S_D$ is introduced into the switching MOS transistors 14 and 34 and the information keeping unit 30.

Figure 5:
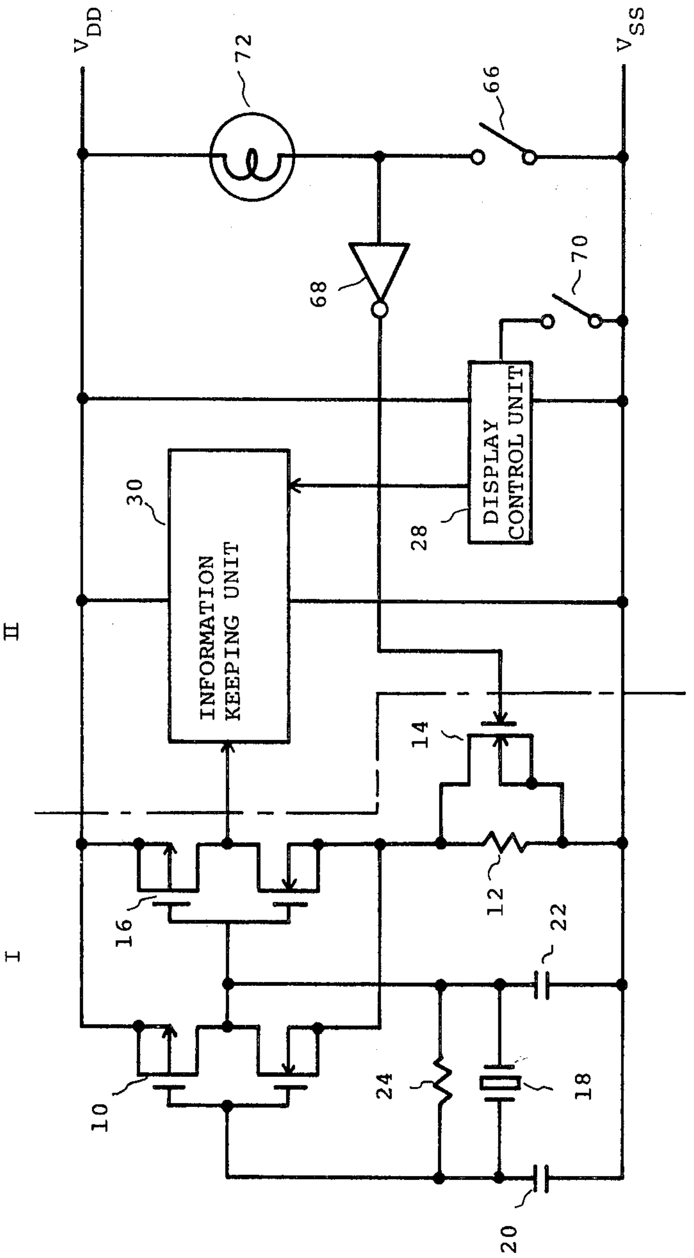
FIG. 5 is a circuit diagram of a further embodiment of a complementary MOS transistor crystal oscillator circuit of the present invention.

FIG. 5 shows a further embodiment of the present invention, wherein liquid crystal material is utilized for the display. Like elements corresponding to those of FIG. 1 are indicated by like numerals.

The crystal oscillation circuit I has the same construction disclosed in FIG. 1. The control circuit II comprises the information keeping circuit 30, the display control unit 28, an illumination lamp 72 for illuminating the liquid crystal display, an illumination lamp 72, an inverter 68 for applying the lamp excitation signal to the gate of the switching MOS transistor 14, and a time information switch 70 for handling the time information, for example, correcting the time information.

When the illumination lamp 72 is excited through the illumination switch 66, the lamp excitation signal is introduced through the inverter 68 into the gate of the switching transisror 14 to make the crystal oscillation circuit I function in afore-mentioned manner.

It will be apparent from the foregoing description that the crystal oscillation circuit I shown in FIG. 2 is applicable to the liquid crystal display system as directed in FIG. 5.

The abovementioned crystal oscillator circuit of the present invention is effectively applied to an electronic apparatus of which the power supply voltage is unavoidable variable over a considerably large range, such as an electronic wristwatch having an LED display or an illumination lamp for liquid crystal display. Therefore, low power dissipation is achieved in the crystal oscillation circuit and no power deviation is influenced by a display load, which requires a large power source, makes the crystal oscillation circuit inoperative. The crystal oscillation circuit is controlled with the LED display switch or the illumination lamp switch of the liquid crystal display.

The present being thus described, it will be obvious that the same may be varied in many ways. Such variations are not to be regarded as a departure from the spirit and scope of the invention, and all such modifications are intended to be included within the scope of the following claims.

What is claimed is:

1. In a complementary MOS transistor crystal oscillator circuit including two power supply terminals, a C-MOS inverter connected across said two power supply terminals, a quartz crystal vibrator connected between an input terminal and an output terminal of the C-MOS inverter, a first source resistor connected between the source of the N-channel transistor of the C-MOS inverter and one of said two power supply terminals, and a second source resistor connected between the source of the P-channel transistor of the C-MOS inverter and the other of said two power supply terminal, the improvement comprising:

- a first switching means connected in parallel to the first source resistor;
- a second switching means connected in parallel to the second source resistor;
- a control means for causing the conduction of said first and second switching means; and
- an enabling means for operating the control means.

2. The complementary MOS transistor crystal oscillator circuit as set forth in claim 1, wherein the enabling means is an actuating switch for enabling an LED display associated with said complementary MOS transistor crystal oscillator circuit.

3. The complementary MOS transistor crystal oscillator circuit as set forth in claim 1, wherein the enabling means is an illumination lamp switch for exciting an illumination lamp of a liquid crystal display which is associated with said complementary MOS transistor crystal oscillator circuit.

4. The complementary MOS transistor crystal oscillator circuit as set forth in claim 1, wherein the first switching means is an N-type transistor, and the second switching means is a P-type transistor.

5. In a complementary MOS transistor crystal oscillator circuit including two power supply terminal, a C-MOS inverter connected across said two power supply terminals, a quartz crystal vibrator connected between an input terminal and an output terminal of the C-MOS inverter, and a source resistor connected between the source of a transistor of the C-MOS inverter and one of said power supply terminals, the improvement comprising:

- a switching means connected in parallel to the source resistor;
- a control means for developing a control signal for causing the conduction of said switching means; and
- an enabling means for activating the control means to develop said control signal, said enabling means including an actuating switch for activating an LED display which displays information correlated to said complementary MOS transistor crystal oscillator circuit.

6. In a complementary MOS transistor crystal oscillator circuit including two power supply terminals, a C-MOS inverter connected across said two power supply terminals, a quartz crystal vibrator connected between an input terminal and an output terminal of the C-MOS inverter, and a source resistor connected between the source of a transistor of the C-MOS inverter and one of said power supply terminals, the improvement comprising:

- a switching means connected in parallel to the source resistor;
- a control means for developing a control signal for causing the condition of said switching means; and
- an enabling means for activating the control means to develop said control signal, said enabling means including an illumination lamp switch for exciting an illumination lamp of a liquid crystal display which displays information correlated to said complementary MOS transistor crystal oscillator circuit.

* * * * *